United States Patent
Lee et al.

(10) Patent No.: US 7,978,099 B2
(45) Date of Patent: *Jul. 12, 2011

(54) 17B/20B CODING SYSTEM

(75) Inventors: Seung-Jong Lee, Santa Clara, CA (US); Daeyun Shim, Saratoga, CA (US)

(73) Assignee: Silicon Image, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/847,416

(22) Filed: Jul. 30, 2010

(65) Prior Publication Data

US 2010/0295711 A1    Nov. 25, 2010

Related U.S. Application Data

(63) Continuation of application No. 12/260,972, filed on Oct. 29, 2008, now Pat. No. 7,777,652.

(51) Int. Cl.
*H03M 7/00* (2006.01)
(52) U.S. Cl. .......................................... 341/59; 341/95
(58) Field of Classification Search .................. 341/55, 341/58, 59, 95
See application file for complete search history.

(56) References Cited

U.S. PATENT DOCUMENTS

| 4,486,739 | A | | 12/1984 | Franaszek et al. |
| 4,591,839 | A | * | 5/1986 | Charboneau et al. ......... 340/620 |
| 5,821,883 | A | * | 10/1998 | Chiba et al. .................... 341/59 |
| 7,385,533 | B2 | * | 6/2008 | Sawada et al. ................. 341/58 |
| 7,599,396 | B2 | | 10/2009 | Boecker et al. |

OTHER PUBLICATIONS

International Search Report & Written Opinion for International Application No. PCT/US/2009/059096 mailed Dec. 7, 2009.

* cited by examiner

*Primary Examiner* — Brian Young
(74) *Attorney, Agent, or Firm* — Blakely, Sokoloff, Taylor & Zafman LLP

(57) ABSTRACT

A method, apparatus and system employing a 17B/20B coder is disclosed. The 17B/20B coder to receive an incoming stream including a 17B block and a 20B block, and partition the 17B block into first blocks, and partitioning the 20B into second blocks. The coder is further to code 17B to 20B of memory using one or more serial lines for communication is performed, wherein coding includes coding the first blocks of the 17B block and the second blocks of the 20B block, wherein the coding of the first and second blocks is performed such that a maximum run length is maintained.

21 Claims, 11 Drawing Sheets

| 5-bit | 6-bit repeated | 6-bit remapped | 5-bit | 6-bit repeated | 6-bit remapped |
|---|---|---|---|---|---|
| 00000 | 000000 | 001000 | 10000 | 100000 | 101000 |
| 00001 | 000001 | 001001 | 10001 | 100001 | |
| 00010 | 000010 | 001010 | 10010 | 100010 | |
| 00011 | 000011 | 001011 | 10011 | 100011 | |
| 00100 | 001100 | | 10100 | 101100 | |
| 00101 | 001101 | | 10101 | 101101 | |
| 00110 | 001110 | | 10110 | 101110 | |
| 00111 | 001111 | 010101 | 10111 | 101111 | 100111 |
| 01000 | 010000 | 011000 | 11000 | 110000 | 101010 |
| 01001 | 010001 | | 11001 | 110001 | |
| 01010 | 010010 | | 11010 | 110010 | |
| 01011 | 010011 | | 11011 | 110011 | |
| 01100 | 011100 | | 11100 | 111100 | 110100 |
| 01101 | 011101 | | 11101 | 111101 | 110101 |
| 01110 | 011110 | | 11110 | 111110 | 110110 |
| 01111 | 011111 | 010111 | 11111 | 111111 | 110111 |

FIG. 5

| 6-bit | 7-bit repeated | 7-bit remapped | 6-bit | 7-bit repeated | 7-bit remapped |
|---|---|---|---|---|---|
| 000000 | 000000 | 0101010 | 100000 | 100000 | 1001000 |
| 000001 | 000001 | 0010001 | 100001 | 100001 | |
| 000010 | 0000010 | 0010010 | 100010 | 1000010 | |
| 000011 | 0000011 | 0010011 | 100011 | 1000011 | |
| 000100 | 0000100 | 0010100 | 100100 | 1000100 | |
| 000101 | 0000101 | 0010101 | 100101 | 1000101 | |
| 000110 | 0000110 | 0010110 | 100110 | 1000110 | |
| 000111 | 0000111 | 0010111 | 100111 | 1000111 | |
| 001000 | 0011000 | | 101000 | 1011000 | |
| 001001 | 0011001 | | 101001 | 1011001 | |
| 001010 | 0011010 | | 101010 | 1011010 | |
| 001011 | 0011011 | | 101011 | 1011011 | |
| 001100 | 0011100 | | 101100 | 1011100 | |
| 001101 | 0011101 | | 101101 | 1011101 | |
| 001110 | 0011110 | | 101110 | 1011110 | |
| 001111 | 0011111 | 0110101 | 101111 | 1011111 | 1010111 |
| 010000 | 0100000 | 0101000 | 110000 | 1100000 | 1001010 |
| 010001 | 0100001 | | 110001 | 1100001 | |
| 010010 | 0100010 | | 110010 | 1100010 | |
| 010011 | 0100011 | | 110011 | 1100011 | |
| 010100 | 0100100 | | 110100 | 1100100 | |
| 010101 | 0100101 | | 110101 | 1100101 | |
| 010110 | 0100110 | | 110110 | 1100110 | |
| 010111 | 0100111 | | 110111 | 1100111 | |
| 011000 | 0111000 | | 111000 | 1111000 | 1101000 |
| 011001 | 0111001 | | 111001 | 1111001 | 1101001 |
| 011010 | 0111010 | | 111010 | 1111010 | 1101010 |
| 011011 | 0111011 | | 111011 | 1111011 | 1101011 |
| 011100 | 0111100 | | 111100 | 1111100 | 1101100 |
| 011101 | 0111101 | | 111101 | 1111101 | 1101101 |
| 011110 | 0111110 | | 111110 | 1111110 | 1101110 |
| 011111 | 0111111 | 011011 | 111111 | 1111111 | 1010101 |

FIG. 7

17B/20B CODING IN MEMORY ACCORDING TO ONE EMBODIMENT

CONVENTIONAL CODING IN MEMORY

17B/20B CODING SYSTEM

CROSS-REFERENCE TO RELATED APPLICATIONS

This is a continuation application of U.S. patent application Ser. No. 12/260,972, filed on Oct. 29, 2008, now U.S. Pat. No. 7,777,652 now allowed, and priority is claimed thereof.

FIELD

Embodiments of the invention generally relate to the field of networks and data transmission and, more particularly, to 17 B/20 B coding system.

BACKGROUND

In data communication, data communication coding (encoding/decoding) is common. For example, PC expansion card interface (PCIe) and serialized hard disk access (SATA) technologies use a byte-oriented DC-balanced run length 8 B/10 B coding is used (see U.S. Pat. No. 4,486,739; see also U.S. Pat. Nos. 5,663,724 and 6,617,984 for 16 B/20 B). This coding is standardized by Joint Electron Device Engineering Council (JEDEC) community. This conventional coding technique has two properties: guaranteeing the run length to be 5 or less; and providing DC-balanced output.

Regarding the first property of 8 B/10 B, the maximum run length property may be important to minimize bit error resulted from analog PHY which helps detect changes of data on a serial line and attempts to find an optimal probing position to minimize bit error. However, if the serial data is less changed than expected, PHY will have less information to decide the probing position in result and thus, results in the increase of the probability of bit error. Further, the maximum allowed distance can be defined in terms of run length, and the number of repeating symbol, etc. Regarding the second property, the DC-balanced output may be important if a serial link is implemented in an AC-coupling. Most of high speed serial line technologies are based on differential wires and data is sensed out by measuring the difference between two wires. To increase compatibility, merely the signal changes pass to the destination with blocking DC component. This technique is called AC-coupling. Although it has a few benefits on the implementation side, but it has an input restriction: the number of 0's and the number of 1's are to be balanced within a certain time period. When the code meets this requirement, it is referred to as DC-balanced. The 8 B/10 B coding provides such good property; however it significantly adds to latency. For example, each byte can be encoded using the 8 B/10 B code, but each coding should refer previous result to meet the DC-balancing requirement, so the calculation is cascaded. The high latency of the 8 B/10 B coding technique results in low memory performance and thus, it is not desirable in many cases, particular in case of mobile devices. When designing mobile devices, memory performance is considered an essential factor.

However, Serial Port Memory Technology (SPMT) is different from conventional memory technologies in that it uses high speed serial link technology in memory area. Using SPMT, reducing latency is essential, while DC balancing is not necessitated. It is, therefore, desired to have a data communication coding system that provides low latency coding without any memory resource complications, resulting in improved memory performance.

SUMMARY

A method, apparatus and system are provided for employing a 17 bit/20 bit coding system including a 17 bit/20 bit encoder/decoder to encode/decode a 17 bit/20 bit code of memory.

In one embodiment, an apparatus includes a 17 B/20 B coder. The 17 B/20 B coder to receive an incoming stream including a 17 B block and a 20 B block, partition the 17 B block into first blocks, and partitioning the 20 B into second blocks, and code 17 B to 20 B of memory using one or more serial lines for communication is performed, wherein coding includes coding the first blocks of the 17 B block and the second blocks of the 20 B block, wherein the coding of the first and second blocks is performed such that a maximum run length is maintained.

In one embodiment, a system includes a 17 B/20 B coding circuit to receive an incoming stream including a 17 B block and a 20 B block, partition the 17 B block into first blocks, and partitioning the 20 B into second blocks, and code 17 B to 20 B of memory using one or more serial lines for communication is performed, wherein coding includes coding the first blocks of the 17 B block and the second blocks of the 20 B block, wherein the coding of the first and second blocks is performed such that a maximum run length is maintained.

In one embodiment, a method includes receiving an incoming stream including a 17 B block and a 20 B block, partitioning the 17 B block into first blocks, and partitioning the 20 B into second blocks, and coding 17 B to 20 B of memory using one or more serial lines for communication is performed, wherein coding includes coding the first blocks of the 17 B block and the second blocks of the 20 B block, wherein the coding of the first and second blocks is performed such that a maximum run length is maintained.

BRIEF DESCRIPTION OF THE DRAWINGS

Embodiments of the invention are illustrated by way of example, and not by way of limitation, in the figures of the accompanying drawings in which like reference numerals refer to similar elements:

FIG. 5 illustrates an embodiment of an encoding table of a 5 B/6 B section mapping of a 17 B/20 B coding system;

FIG. 7 illustrates an embodiment of an encoding table of a 6 B/7 B section mapping of a 17 B/20 B coding system;

DETAILED DESCRIPTION

Figure 1:
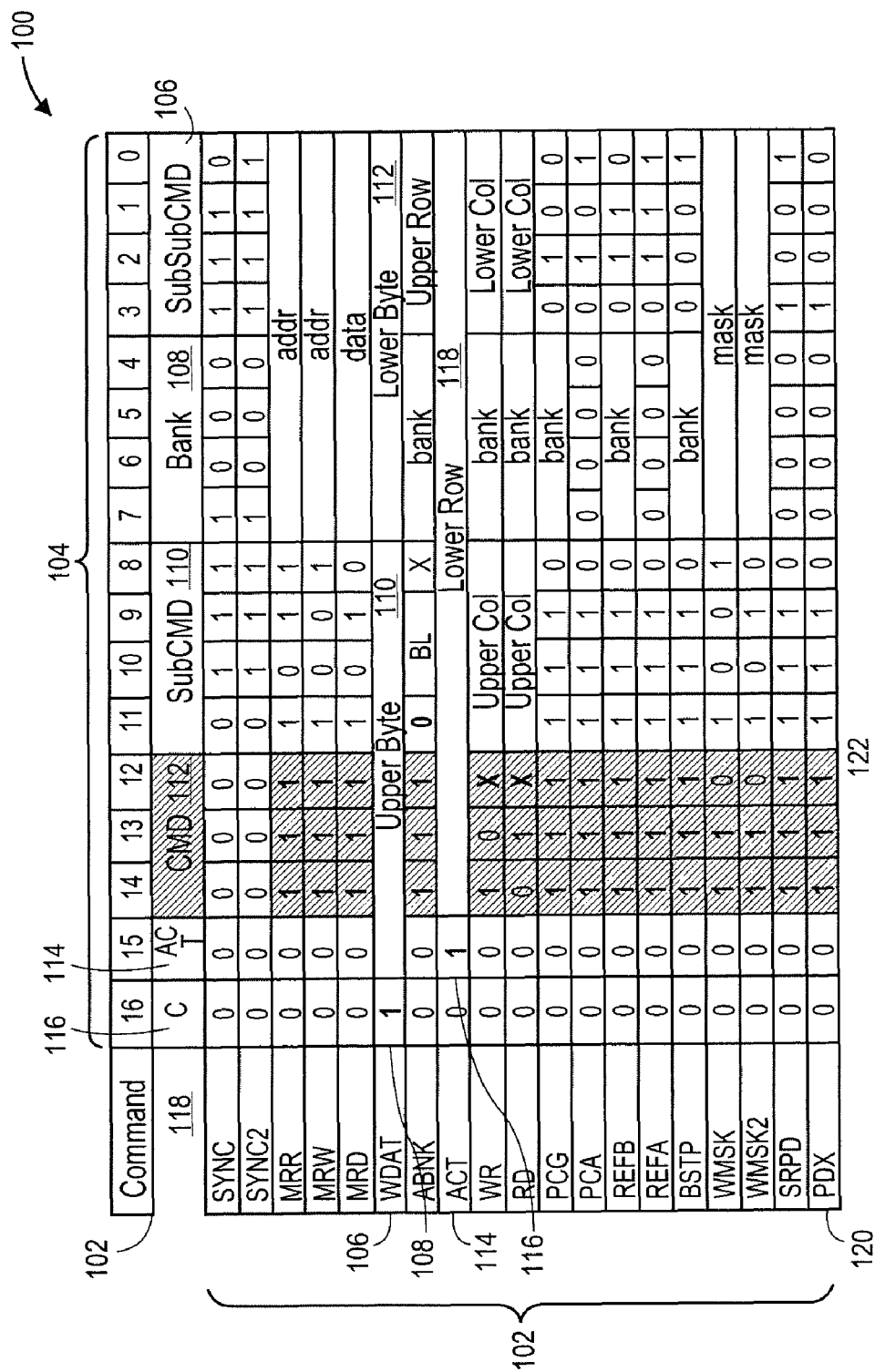
FIG. 1 illustrates an embodiment of 17 B/20 B coding system employing SPMT command encoding.

Embodiments of the invention are generally directed to 17 B/20 B coding system.

As used herein, "network" or "communication network" mean an interconnection network to deliver digital media content (including music, audio/video, gaming, photos, and others) between devices. An entertainment network may include a personal entertainment network, such as a network in a household, a network in a business setting, or any other network of devices and/or components. In a network, certain network devices may be a source of media content, such as a digital television tuner, cable set-top box, video storage server, and other source device. Other devices may display or use media content, such as a digital television, home theater system, audio system, gaming system, and other devices. Further, certain devices may be intended to store or transfer media content, such as video and audio storage servers. Certain devices may perform multiple media functions. In some embodiments, the network devices may be co-located on a single local area network. In other embodiments, the network devices may span multiple network segments, such as through tunneling between local area networks. The entertainment network may include multiple data encoding and encryption processes.

SPMT is different from conventional memory technologies (e.g., dynamic random access memory (DRAM)) in that it uses high speed serial link technology in memory area. Using SPMT, reducing latency is essential, while DC balancing is not necessitated. For example, a DC-coupled link (as opposed to DC balanced) is provided and memory remains attached on the board after being soldered on and thus, DC-balanced code is not required. Further, for SPMT, memory performance is sensitive to latency because serial links takes many more cycles compared to a conventional DRAM interface. Hence, sequential and complex coding systems, such as the 8 B/10 B coding, are not suitable for SPMT as they end up dramatically increasing hardware latency.

SPMT is regarded as a new memory interface architecture, initially targeted for DRAM chips, that employs a serial interface architecture as opposed to a parallel interface architecture as commonly found in current memory technologies. SPMT typically uses a high speed serial link technology in a memory area, providing the benefits of low power and reduced pin counts when connecting between a host and a memory. However, if memory bandwidth requirement gets higher than a high speed link can support (e.g., several Gbps), multiples serial links must be used. Therefore, when a host is to send a large amount of data (e.g., read-data, write-data) at once, the memory is to be provided with enough bandwidth to pass the large amount of data through the multiple serial links or serial channels.

A method, apparatus and system are provided for employing a 17 bit/20 bit coding system including a 17 bit/20 bit encoder/decoder to encode/decode a 17 bit/20 bit code of memory. In one embodiment, an apparatus including a 17 B/20 B coder is provided. The 17 B/20 B coder to receive an incoming stream including a 17 B block and a 20 B block, partition the 17 B block into first blocks, and partitioning the 20 B into second blocks, and code 17 B to 20 B of memory using one or more serial lines for communication is performed, wherein coding includes coding the first blocks of the 17 B block and the second blocks of the 20 B block, wherein the coding of the first and second blocks is performed such that a maximum run length is maintained. The coding of the memory is performed concurrently with coding of a command, wherein the coding includes encoding or decoding, wherein selection of encoding of the command enables decoding of the command without passing a code decoder. Further, merging of the first blocks into the second blocks is performed to form an encoded 17 B/20 B code block, wherein the coding is applied to DRAM, static random access memory (SRAM), read only memory (ROM), and flash memory, etc.

Embodiment of the present invention provide a 17 B/20 B coding system having a run length of 5 bit or less that maps 17 bit codes to 20 bit space or vice versa. This is technique is compatible with various systems, such a SPMT, DRAM, fiber optics etc. In one embodiment, an extra bit (the $17^{th}$ bit) is provided to be used as a command bit to contain a command to indicate command/data along with a 16-bit data payload to provide an embodiment of a 17 B/20 B code and thus, the hardware implementation is simple and easier to implement even when circuits are drawn manually (e.g., even in case of DRAM), resulting in minimum latency. In one embodiment, 17 B/20 B coding is used to fulfill any number of coding requirements of various data transmission and storing systems and while reducing or even removing latency for systematic optimization.

FIG. 1 illustrates an embodiment of 17 B/20 B coding system 100 employing SPMT command encoding. The illustrated embodiment of 17/20 B coding system 100 provides 17 B/20 B encoding of 19 SPMT commands 102 (e.g., SYNC, SYNC2, MRR, MRW, PDX, etc.) mapped to 17-bit encodings. The 17 bit encoding domain 104 is divided into command fields sub-sub-command (SubSubCMD) 106, sub-command (SubCMD) 110, command (CMD) 112, bank 108, and two command type fields 114, 116 reflecting whether it is a command (C) 116 or an activation command (ACT) 114 to distinguish the type of command. An ACT command 114 (bit 15) is a specially treated command because it contains a long address. Column 102 (that could be regarded as the $18^{th}$ bit) lists the names of the commands.

Depending on a command type of a command 102, any number of bits 122 may be used to identify the command 102. For example, in case of command WDAT 106, bit 16 (C), which is the $17^{th}$ bit of the domain 104, is used to identify having a 1 108, and other 16 bits 0-15 are used as upper byte 110 and lower byte 112. Similarly, in case of command ACT 114, bit 15 (ACT), which is the $16^{th}$ bit of the domain 104, is used to identify having a 1 116, bit 16 remains 0, while the other 15 bits (bits 0-14) include lower row 118. Further, in case of command PDX 120, all 17 bits (bits 0-16) are used to identify the command.

The illustrated embodiment of 17 B/20 B coding system 100 employing a mapping of 17 bits of (en)coding domain 104 and 20 bits of commands (having 19 commands 102) that includes a single bit 116 to indicate command or data and 16 bits to contain the corresponding data payload. Coding system 100 further provides a mapping of a run length of 5 or less, reduced latency, and simplified hardware implementation such that coding system 100 can be implemented various memory systems/architectures, such as DRAM, even when circuits are manually drawn. Run length refers to sequential number of 0's and 1's. For example, a sequence of 100011 would have a run length of 3 since the sequence contains 3 zeros. Similarly the sequence of 10101 has a run length of 1 since there is not a sequence of consecutive 0's or 1's.

Figure 2:
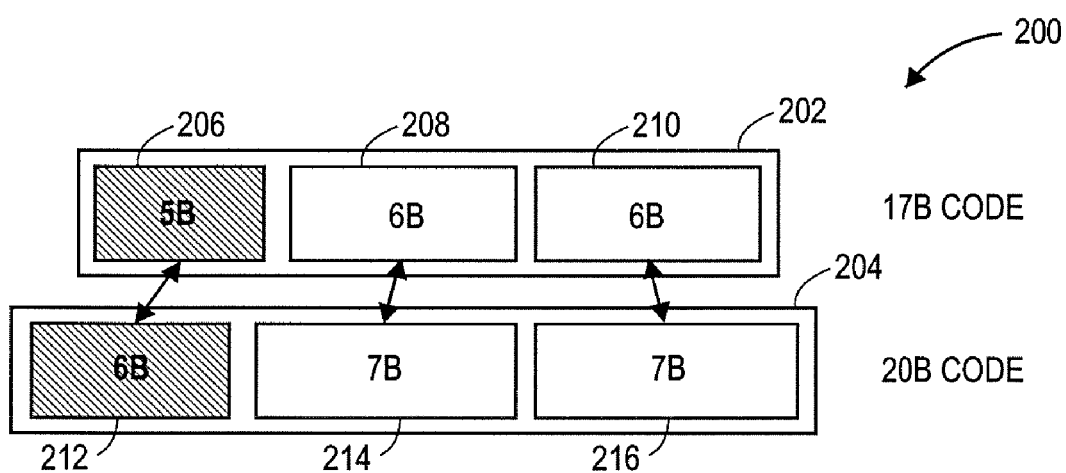
FIG. 2 illustrates an embodiment of a mapping of 17 B code and 20 B code into a 17 B/20 B coding system.

FIG. 2 illustrates an embodiment of a mapping of 17 B code and 20 B code into a 17 B/20 B coding system. In the illustrated embodiment, 17 B/20 code 200 is being computed in parallel after the partitioning of the 17 B/20 B code.

Although the 17 B and 20 B codes 202, 204 may be divided in any number of ways, in the illustrated embodiment, for example, the 17 B code 202 is divided into three sections of 5 bits 206, 6 bits 208, and 6 bits 210, while the 20 B code 204 is divided into three sections of 6 bits 212, 7 bits 214, and 7 bits 216. The three sections 206-210 of the 17 B code 202 are mapped with the sections 212-216 of the 20 B code 204.

As illustrated, 5 B 206 of 17 B code 202 is mapped with 6 B 212 of 20 B code 204 and similarly, 6 B 208 is mapped with 7 B 214 and 6 B 210 is mapped with 7 B 216. These mapped sections are then merged into the 17 B code 202 and the 20 B code 204. This process is further described with reference to FIGS. 3A-3B. In one embodiment, 17 B/20 B code 200 is computed in parallel after the partitioning of the 17 B code 202 and the 20 B code 204 into their respective sections 206-216. The sections 206-216 are merged and mapped to communicate, but they may stay separate and parallel.

Figure 3A:
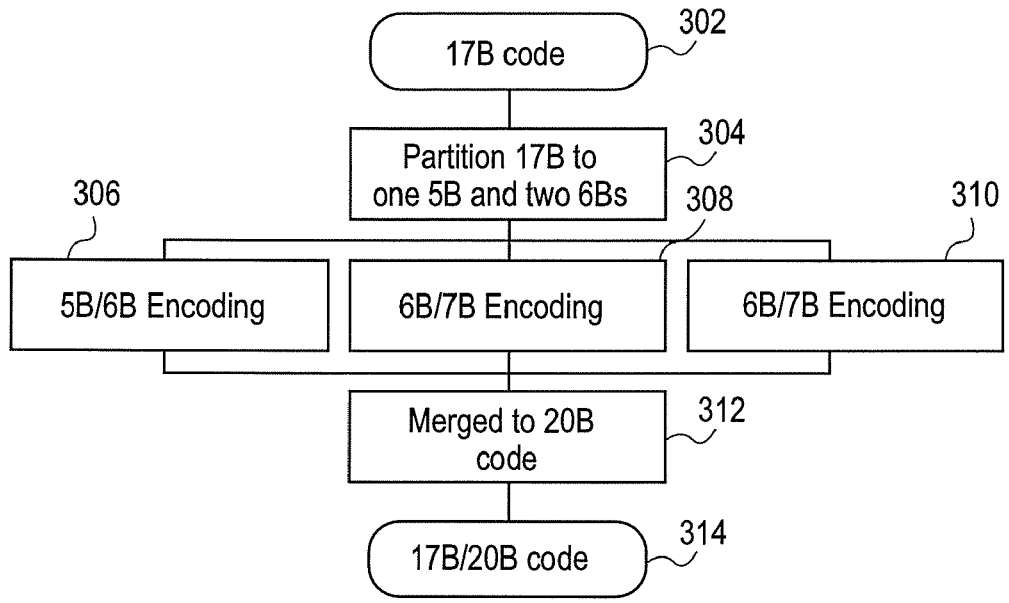
FIG. 3A illustrate an embodiment of a process for partitioning the 17 B code of the 17 B/20 B code.

FIG. 3A illustrates an embodiment of a process for partitioning a 17 B code 302 of a 17 B/20 B code. In one embodiment, the 17 B code 302 is partitioned into three code sections of a 5 B code and two 6 B codes at processing block 304. At processing block 306, the 5 B code of the 17 B code 302 is mapped to the 6 B code of a 20 B code of the 17 B/20 B code. Similarly, at processing block 308, the 6 B code of the 17 B code 302 is mapped to the 7 B code of the 20 B code, while the 6 B code of the 17 B code 302 is mapped to the 7 B code of the 20 B code at processing block 310. At processing block 312, the three partitioned code sections of the 17 B code 302 are merged with the three partitioned code sections of the 20 B code to form the 17 B/20 B code 314.

Figure 3B:
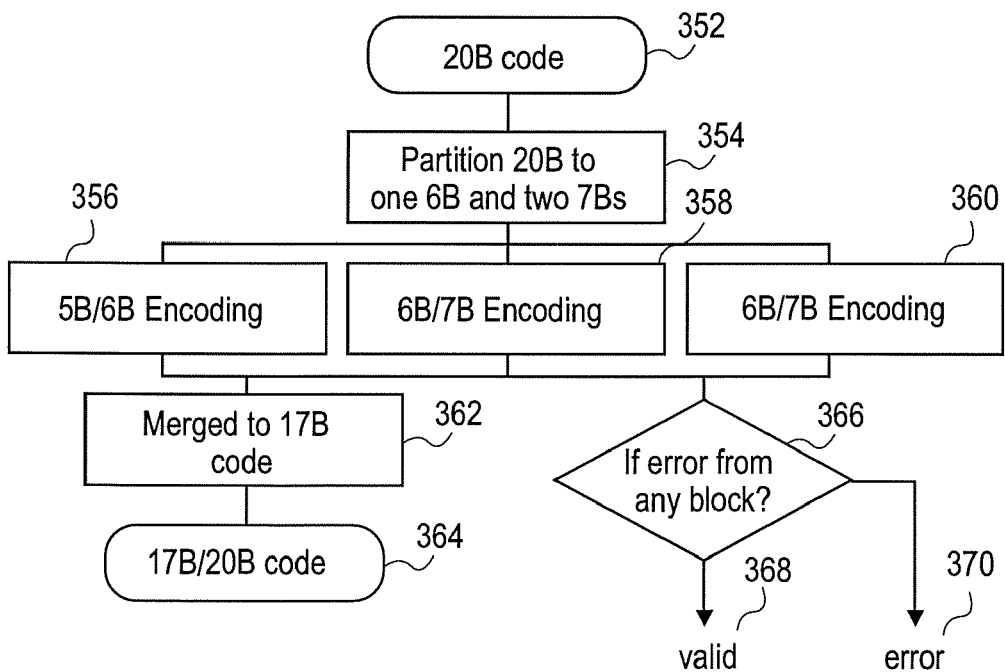
FIG. 3B illustrate an embodiment of a process for partitioning the 20 B code of the 17 B/20 B code.

FIG. 3B illustrates an embodiment of a process for partitioning a 20 B code 352 of a 17 B/20 B code. In one embodiment, the 20 B code 352 is partitioned into three code sections of a 6 B code and two 7 B codes at processing block 354. At processing block 356, the 5 B code of a 17 B code of the 17 B/20 B code is mapped to the 6 B code of the 20 B code 352. Similarly, at processing block 358, the 6 B code of the 17 B code is mapped to the 7 B code of the 20 B code 354, while the 6 B code of the 17 B code is mapped to the 7 B code of the 20 B code 352 at processing block 360. At processing block 362, the three partitioned sections of the 20 B code 352 are merged with the three partitioned sections of the 17 B code to form the 17 B/20 B code 364. At decision block 366, a determination is made as to whether an error was detected from any of the blocks. If there was error detected, the error is thrown 370. If not, the 17 B/20 B code 364 is considered valid 368.

Figure 4B:
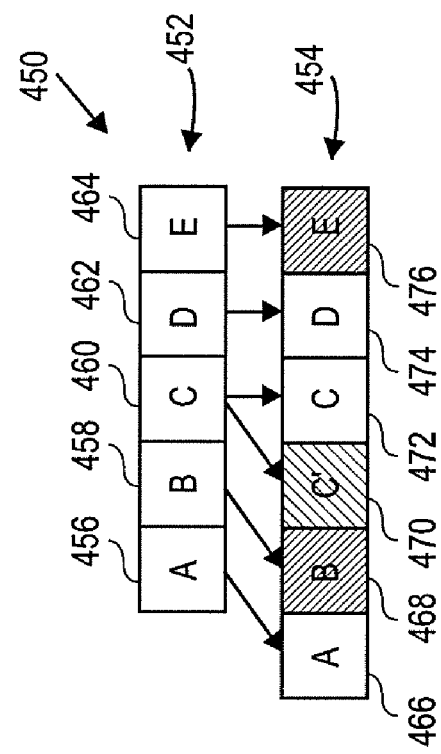
FIGS. 4A and 4B illustrate embodiments of 5 B/6 B section mappings of a 17 B/20 B coding system while preserving maximum run length requirements.
Figure 4A:
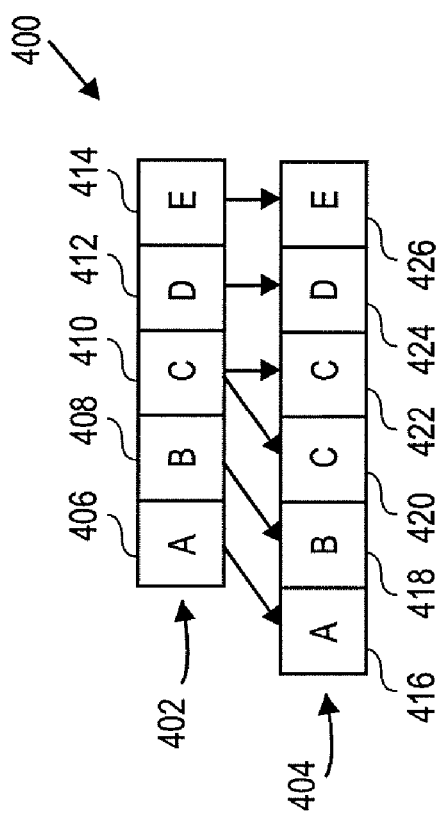

FIGS. 4A and 4B illustrate embodiments of 5 B/6 B section mappings 400, 450 of a 17 B/20 B coding system while preserving maximum run length requirements. One characteristics of a transition code, such as 17 B/20 B transition code, is the maximum run length. To satisfy this characteristic, each section is designed to satisfy this characteristic. This characteristic is also met on the boundary of adjacent section of the code. For example, to make the calculation in parallel, the following conditions are employed: (1) keeping the maximum run length of each section to be 5 and less; (2) keeping the run length counted from the header not to exceed 2; and run length counted reversely from the tail not to exceed 3. Using the second and third conditions, the run length characteristics are met both in the section boundary and the command boundary. The section coding may be based on the "repeating code", which is regarded as a basic transition code, and compared to repeating each bit in the "repeating code", there is one bit for repeating in the target space. Since run length characteristics from head and tail of each section exist, a proper position for the repeated code is the $3^{rd}$ bit position of a 6 bit output code section or the center $4^{th}$ bit of a 7 bit output code section. If an output section code meets these three run length characteristics, it is then provided as a valid output. If not, a code section is remapped using new algorithm, such as a flipping center bit.

For example, referring to FIG. 4A, mapping 400 of section 5 B 402 of 17 B with section 6 B 404 of 20 B is illustrated. FIG. 4A illustrates a basic rule which duplicates center bit 420, 422. As illustrated, bit A 406 is mapped with bit A 416 and, similarly, bits B 408, D 412, E 414 are mapped with bits B 418, D 424, E 426, respectively. As mentioned above, the middle bit C 410 is mapped with the middle bit C 420, 422 using the "repeating code" technique. In other words, the center bit of the 6 bit output section 404 is duplicated or repeated twice as C 420 and C 422 and mapped with C 410.

Referring now to FIG. 4B, mapping 450 of section 5 B 452 of 17 B with section 6 B 454 of 20 B is illustrated. FIG. 4B illustrates an exceptional rule when the result of basic rule violates one or more run length requirements (e.g., run length of 5, header run length of 2, and tail run length of 3). As illustrated, bit A 456 is mapped with bit A 466 and, similarly, bits B 458, D 462, E 464 are mapped with bits B' 468, D' 474, E 476, respectively. As mentioned above, the middle bit C 460 is mapped with the middle bit C' 470 and C 472 using the "repeating code" technique. In other words, the center bit of the 6 bit output section 454 is duplicated or repeated twice as C' 470 and C 472 and mapped with C 460. B 418 being a target refers to a "0", while B' 468 being a target could be a "0" or a "1". Similarly, C 420 and D 424 being targets, each of them contains a "0", while C' 470 and D' 474 being targets, each of them contains a "0" or a "1".

FIG. 5 illustrates an embodiment of an encoding table 500 of a 5 B/6 B section mapping of a 17 B/20 B coding system. The illustrated embodiment provides an encoding table 500 for a 5 B/6 B mapping while preserving a maximum run length of 5, a maximum header run length of 2, and a maximum tail run length of 3. The three columns include a first column 502 of 5-bit sequences, a second column 504 of 6-bit output sequences by repeating the third bit of each of the 5-bit sequences of the first column 502 using the repeating code technique, and a third column 506 having those selected sequences of the second column 504 that require a flipping of the third digit (e.g., from 0 to 1 or 1 to 0) when necessary to satisfy one or more run length requirements.

In the illustrated embodiment, sequence 508 (00000) is mapped to sequence 510 (000000) having repeated the third bit 0 of sequence 508. Now, the six "consecutive" zeros of sequence 510 (000000) violate the maximum run length of 5, the maximum header run length of 2, and the tail maximum run length of 3. To correct these violations, the third bit 0 of sequence 510 is flipped to 1 providing sequence 512 (001000) which satisfies the three requirements of the overall run length of 5 or less (e.g., neither the 0 nor the 1 is recorded more than 5 consecutive times), the header run length of 2 or less (e.g., the first two consecutive 0's), and the tail run length of 3 or less (e.g., the last three consecutive 0's) as illustrated. In the illustrated embodiments, fourteen rows 514-540 of thirty-two rows have similar violation issues of one or more run length requirements and they are corrected as the results of such correction are provided in the third column 506.

For example, in case of row 520, sequence 542 (00011) is provided as sequence 544 (000011) with a duplicated third bit of 0. In this case, sequence 544 (000011) meets the run length requirement of 5 since there are no more than 5 consecutive 0's or 1's and, similarly, meets the tail run length requirement of 3 since there are only two consecutive 1's forming the tail. However, in sequence 544 (000011), the header requirement of 2 is violated due to having 4 consecutive 0's forming the header. Having flipped the third digit 0 of sequence 544 to 1 forms sequence 546 (001011) in the third column 506 which then satisfies the header requirement of 2 having two 0's forming the header. For brevity, other such rows 516-518, 522-540 are not discussed in detail, but employ similar technique as explained with respect to rows 514, 520.

Figure 6B:
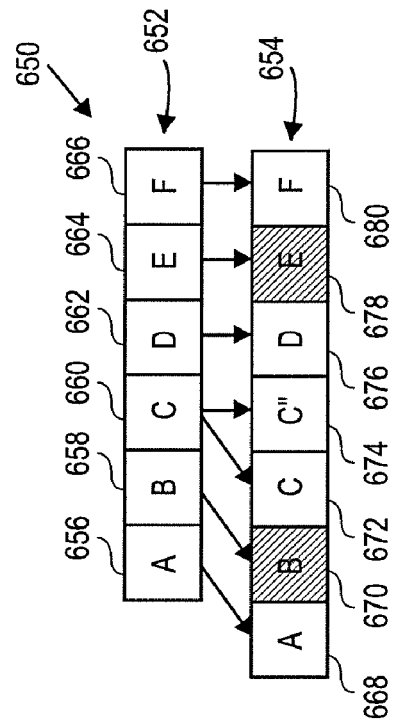
FIGS. 6A and 6B illustrate embodiments of 6 B/7 B section mapping of a 17 B/20 B coding system while preserving maximum run length requirements.
Figure 6A:
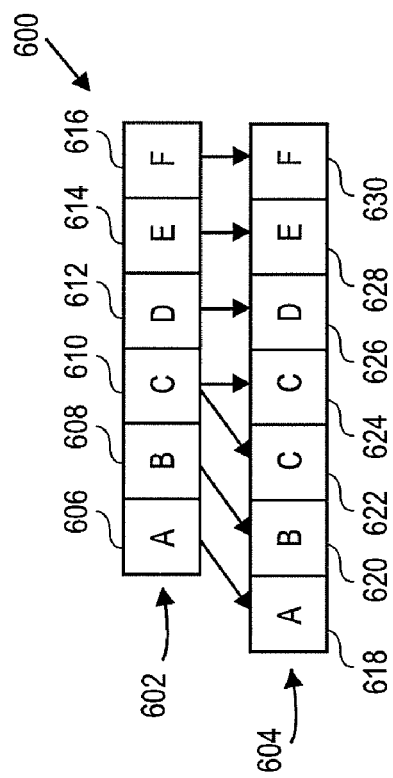

When closely observing table 500, it is realized that sequences of codes that require remapping (e.g., rows 514-540) can be grouped into two groups: they either start with 000 or 111 or they end with 000 or 111. These conditions may be met separately or concurrently depending on the given sequence of the code. Unfortunately, the output of two sequence patterns 00111 and 11000 may conflicts with other outputs when the exceptional rules described above are applied. For example, another rule may be employed to handle such odd cases. However, all rules, including the exceptional rules described above, and the encoding techniques can be described as the following equations:

$abcde \rightarrow$ $a\overline{b}cc\overline{d}e$ where $a = b$ and $c = d = e$, but not $b = c$ $ab\overline{c}cde$ where $a = b = c$ or $c = d = e$ $abccde$ otherwise 5B to 6B Encoding $abcdef \rightarrow$ $abdef$ where $c = d$ $abdef$ where $a = b$ or $d = e = f$ while not $c = d$ $a\overline{b}d\overline{e}f$ where $a = d = f$ and $b = c = e$, but not $c = d$ 6B to 5B Decoding FIGS. 6A and 6B illustrate embodiments of 6 B/7 B section mappings 600, 650 of a 17 B/20 B coding system while preserving maximum run length requirements. For brevity, features described in reference to FIGS. 4A and 4B are not described here. With reference to FIG. 6A, as described with reference to the 5 B/6 B code mapping of FIG. 4A, the basic rule of repeating the third bit C 622, 624 of section code 604 is employed and mapped with the third bit C 610 of section code 602. As illustrated, bit A 606 is mapped with bit A 618 and, similarly, bits B 608, D 612, E 614, F 616 are mapped with bits B 620, D 626, E 628, F 630 respectively.

Referring now to FIG. 6B, illustrates an exceptional rule when the result of basic rule violates one or more run length requirements (e.g., run length of 5, header run length of 2, and tail run length of 3). As illustrated, bit A 656 is mapped with bit A 668 and, similarly, bits B 658, D 662, E 664, F 666 are mapped with bits B' 670, D 676, E' 678, F 680 respectively. As mentioned above, the middle bit C 660 is mapped with the middle bit C' 672 and C" 674 using the "repeating code" technique. In other words, the center bit of the 7 B code output section 654 is duplicated or repeated twice as C' 672, C" 674 and mapped with C 660 of the 6 B code output section 652. Further, B 620 being a target refers to a "0", while B' 670 being a target could be a "0" or a "1". Similarly, C' 672, C" 674 and E' 678 being targets, each of them contains a "0" or a "1".

FIG. 7 illustrates an embodiment of an encoding table 700 of a 6 B/7 B section mapping of a 17 B/20 B coding system. For brevity, many of the features already described in reference to FIG. 5 are not discussed here. The illustrated embodiment provides an encoding table 700 for a 6 B/7 B mapping while preserving a maximum run length of 5, a maximum header run length of 2, and a maximum tail run length of 3. The three columns include a first column 702 of 5-bit sequences, a second column 704 of 6-bit output sequences by repeating the third bit of each of the 5-bit sequences of the first column 502 using the repeating code technique, and a third column 706 having those selected sequences of the second column 504 that require a flipping of the third digit (e.g., from 0 to 1 or 1 to 0) when necessary to satisfy one or more run length requirements. In the illustrated embodiment, twenty-two rows 714-756 of forty-two rows need the third column 706 to satisfy the run length requirements.

For example, code sequence 708 (000001) is mapped to code sequence 710 (0000001) having repeated the third bit 0 of sequence 708. Now, the six "consecutive" zeros of code sequence 710 (0000001) violate the maximum run length of 5 and the maximum header run length of 2. However, with the last digit "1" representing the tail of sequence 710, the tail maximum run length of 3 is satisfied. To correct the other two run length violations, the third bit 0 of sequence 710 is flipped to 1 providing sequence 712 (0010001) in the third column 706 which satisfies the three requirements of the overall run length of 5 or less (e.g., neither the 0 nor the 1 is recorded more than 5 consecutive times), the header run length of 2 or less (e.g., the first two consecutive 0's), and the tail run length of 3 or less (e.g., the last digit of 1) as illustrated.

Figure 8:
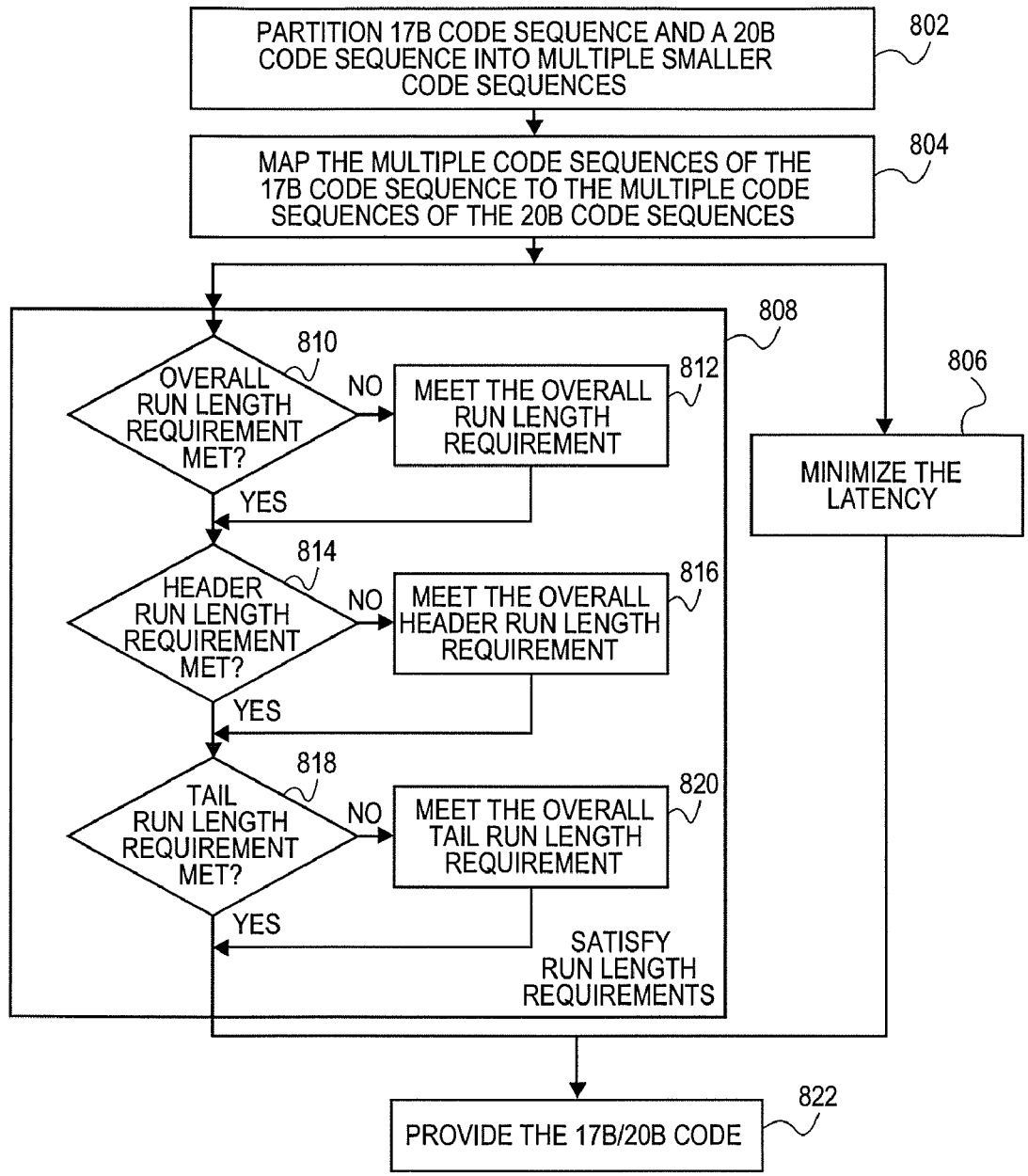
FIG. 8 illustrates an embodiment of a process for 17 B/20 B encoding/decoding.

As with FIG. 5, the encoding techniques and the employed exceptional rules to satisfy the run length requirements can be summarized by the following equations:

$abcdef \rightarrow$ $a\overline{b}c\overline{c}d\overline{e}f$ where $a = b$ and $c = d = e = f$ $ab\overline{c}cdef$ where $a = b = c$, but not $c = d = e = f$ $abc\overline{c}def$ where $c = d = e = f$, but not $a = b$ $abccdef$ otherwise 6B to 7B Encoding $abcdefg \rightarrow$ $abdefg$ where $c = d$ $abdefg$ where $a = b$, but not $d = e = f$ $abcefg$ where $c = e = f = g$, but not $c = d$ $a\overline{b}ce\overline{f}g$ where $a != b$ and $(c = e = f$ and $d = f$ but $c != d)$ 7B to 6B Decoding FIG. 8 illustrates an embodiment of a process for 17 B/20 B encoding/decoding. In one embodiment, at processing block 802, 17 B and 20 B code sequences are partitioned into multiple sequences, such as a 17 B code sequence is divided into 5 B, 6 B and 6 B code sequences, while a 20 B code sequence is divided into 6 B, 7 B, and 7 B code sequences. At processing block 804, the three code sequences of the 17 B code sequence are mapped with the three code sequences of the 20 B code sequence. It is contemplated that the partitioning of the code sequences can be done in any number of sizes or numbers or forms, such as the three smaller code sequences or the mapping of such code sequences with other code sequences are provided here merely as examples and the embodiments of the present invention are not limited to such examples.

At processing block 806, one or more latency reducing techniques are applied to reduce or minimize latency. For example, the command decoding and the code decoding of the 17 B/20 B code and their multiple code sequences are performed in parallel in the code domain as referred to in FIG. 10. Further, various processes are performed to ensure that run length requirements are satisfied 808. These processes are discussed with reference to FIGS. 4A, 4B, 5, 6A, 6B and 7. At decision block 810, a determination is made as to whether the overall maximum run length requirement of 5 bits is met. If not, the requirement is met (such as by flipping a digit of the code sequence) at processing block 812. If yes, the process continues with decision block 814 where a determination is made as to whether the maximum header run length requirement of 2 bits is met. If not, the requirement is met (such as by flipping a digit of the code sequence) at processing block 816. If yes, the process continues with decision block 818 where a determination is made as to whether the maximum tail run length requirement of 3 bits is met. If not, the requirement is met (such as by flipping a digit of the code sequence) at processing block 820. If yes, all run length requirements are met and a 17 B/20 B code sequence is provided at block 822.

Figure 9:
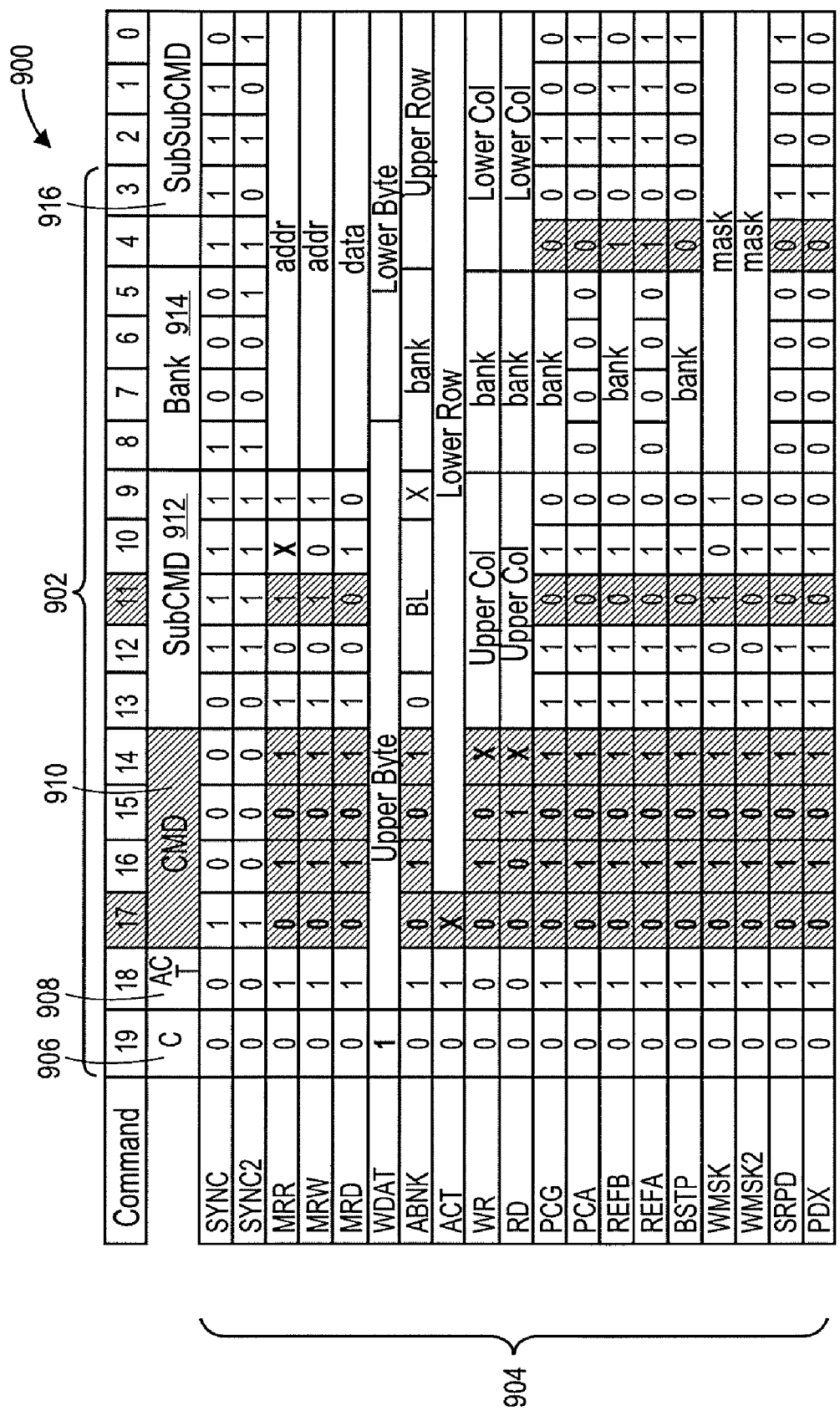
FIG. 9 illustrates an embodiment of a table illustrating latency hiding with pre-coding.

FIG. 9 illustrates an embodiment of an encoded command table 900. In one embodiment, latency hiding as well as latency hiding with pre-decoding is achieved using the results of the table 900 of the 17 B/20 B code techniques. Also, latency hiding with pre-coding can be accomplished using the benefits of 17 B/20 B coding techniques. The illustrated embodiment of the table 900 includes an SPMT command encoding as defined in a 20-bit domain 902. These 19 SPMT commands 904 are provided in a 20-bit code space or domain 902. In one embodiment, 5 B/6 B and 6 B/7 B code schemes or sequences are based on the "code repeating" technique, such as on repeating the center bit of the code sequence, the code sequence may have a property that preserves its header bits and tail bits. Using this property allows for performing decoding commands in earlier stages of the decoding processes, which serves as a benefit. The command bits include command (C) 906 which represents the $20^{th}$ bit, which action command (ACT) 908 is provided in bit 18 (which represents the $19^{th}$ bit). The next few bits 14-17 represents the CMD field 910 and all commands can be decoded here with looking up 6-bits. Any further code sequence partitions (e.g., second code sequence, third code sequence), for example, having 6 bits each, may have an unfixed field, such as bank 914 (occupying bits 5-8). A careful selection of encodings for each command, a code can be made in another field, such as Sub-CMD 912 (occupying bits 9-13) or SubSubCMD 916 (occupying bits 0-3) fixed in an output space, independently to bank value. Stated differently, in one embodiment, command decoding can be performed in a 20-bit domain 902, resulting in latency hiding in pre-coding.

Figures 10A, 10B:
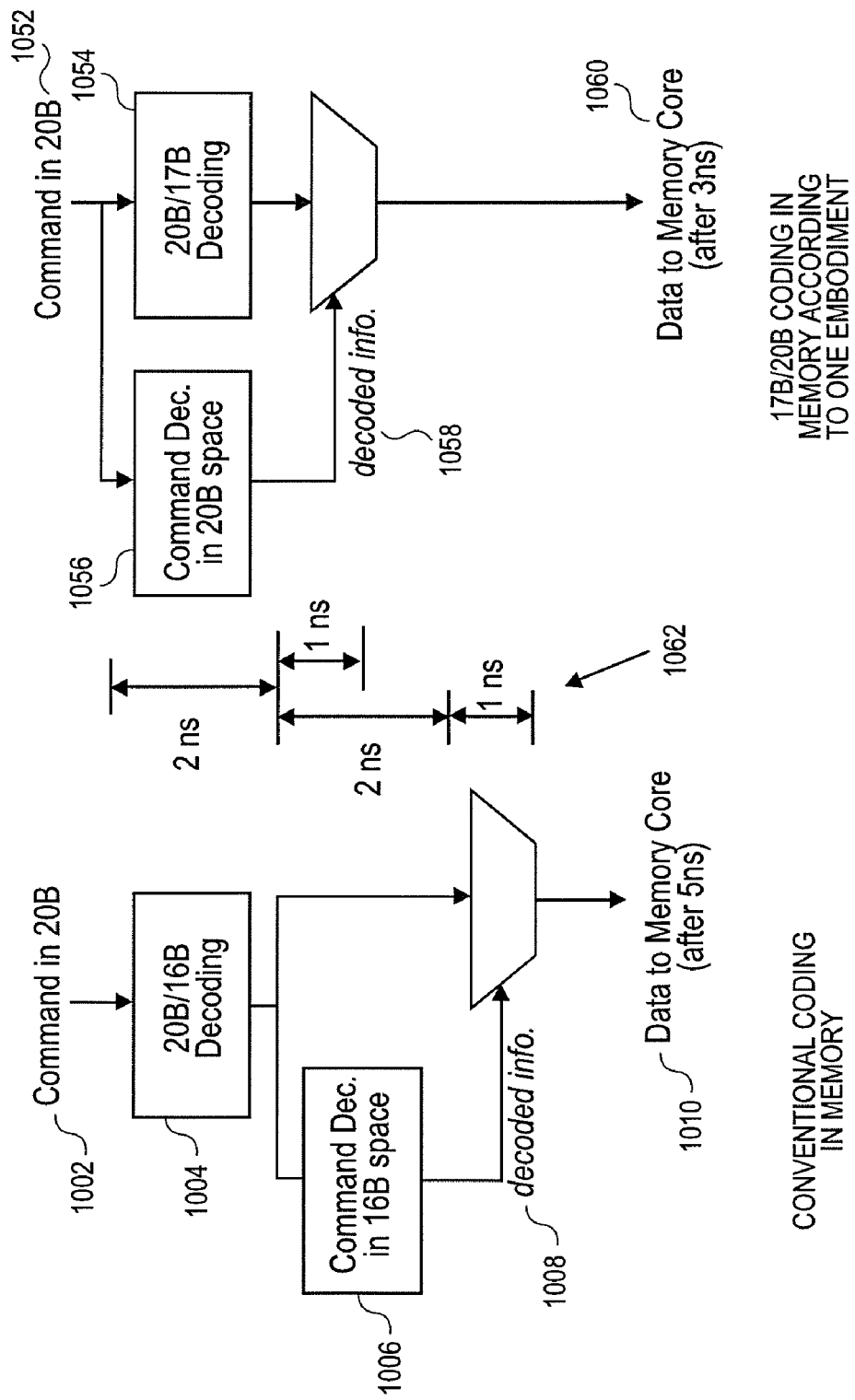
FIG. 10A illustrates a conventional process for sequential transition code decoding and command decoding.
FIG. 10B illustrates an embodiment of a process for parallel transition code decoding and command decoding.

FIG. 10A illustrates a conventional process for sequential transition code decoding and command decoding. As illustrated, in this conventional process, code decoding and command decoding are performed sequentially. For example, a command in 20 B is received 1002. Code decoding of 20 B/16 B code is performed at processing block 1004. This takes about 2 nano seconds (ns) of time. Then, command decoding is performed in a 16 B domain resulting in an additional 2 ns of time. Finally, the decoded information 1008 of the code and the command is provided and passed on to the memory core 1010 adding another ns and thus, taking a total of 5 ns.

FIG. 10B illustrates an embodiment of a process for parallel transition code decoding and command decoding. In one embodiment, the parallel and concurrent decoding of the code and command (both having the same logic stages for decoding) in a 20 B domain provide for latency hiding in precoding. In the illustrated embodiment, the entire process is performed in 3 ns, which is 2 ns or 40% faster than the conventional process (FIG. 10A). Hence, lowering latency by 40%. As illustrated, a command in 20 B is received 1052. The command is then decoded in a 20 B domain space 1056 concurrently or in parallel with the decoding of the 20 B/17 B code at processing block 1054. This step takes 2 ns. Once the decoding is performed, the decoding information 1058 is collected and passed to the memory core 1060, which takes an additional ns of time and thus, a total of 3 ns are needed to perform the parallel command and code decoding. This parallel decoding using the 17 B/20 B transition coding system, in one embodiment, reduces the total latency by 2 ns and enhances the speed by 40%. The time transaction 1062 can be used to compare the speed of the conventional process (FIG. 10A) with the speed of an embodiment of a faster, enhanced, and efficient process (FIG. 10B).

Figure 11:
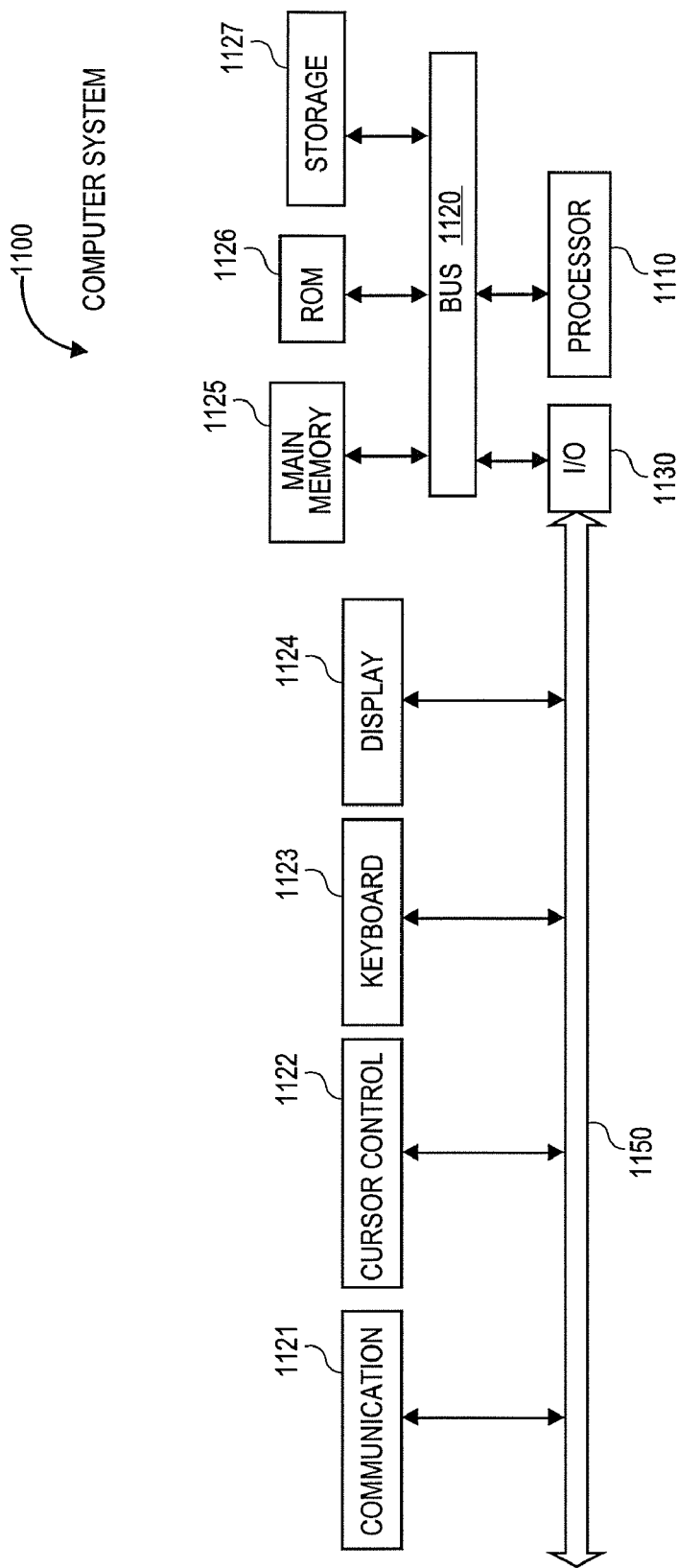
FIG. 11 is an illustration of a computer system on which an embodiment of the present invention may be implemented.

FIG. 11 is an illustration of a computer system on which an embodiment of the present invention may be implemented. Computer system 1100 includes a system bus 1120 for communicating information, and a processor 1110 coupled to bus 1120 for processing information. According to one embodiment, processor 1110 is implemented using one of the multitudes of microprocessors. Nevertheless one of ordinary skill in the art will appreciate that other processors may be used.

Computer system 1100 further comprises a random access memory (RAM) or other dynamic storage device 1125 (referred to herein as main memory), coupled to bus 1120 for storing information and instructions to be executed by processor 1110. Main memory 1125 also may be used for storing temporary variables or other intermediate information during execution of instructions by processor 1110. Computer system 1100 also may include a ROM and or other static storage device 1126 coupled to bus 1120 for storing static information and instructions used by processor 1110.

A data storage device 1125 such as a magnetic disk or optical disc and its corresponding drive may also be coupled to computer system 1100 for storing information and instructions. Computer system 1100 can also be coupled to a second input/output (I/O) bus 1150 via an I/O interface 1130. A plurality of I/O devices may be coupled to I/O bus 1150, including a display device 1124, an input device (e.g., an alphanumeric input device 1123 and or a cursor control device 1122). The communication device 1121 is for accessing other computers (servers or clients) via external data network. The communication device 1121 may comprise a modem, a network interface card, or other well-known interface device, such as those used for coupling to Ethernet, token ring, or other types of networks. Computer system 1100 includes, but is not limited to, a network computer device, a mobile telephone, a personal data assistant (PDA), etc.

Computer system 1100 may be interconnected in a client/server network system. A network may include a Local Area Network (LAN), Wide Area Network (WAN), Metropolitan Area Network (MAN), intranet, the Internet, etc. As stated elsewhere in this document, any number of network devices can be cascaded into being connected with a port multiplier forming a networking mechanism within a network. It is contemplated that there may be any number of devices connected via the network. A device may transfer data streams, such as streaming media data, to other devices in the network system via a number of standard and non-standard protocols, including the protocols described in this document.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form. There may be intermediate structure between illustrated components. The components described or illustrated herein may have additional inputs or outputs which are not illustrated or described.

Various embodiments of the present invention may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

One or more modules, components, or elements described throughout this document, such as the ones shown within or associated with an embodiment of a port multiplier enhancement mechanism may include hardware, software, and/or a combination thereof. In a case where a module includes software, the software data, instructions, and/or configuration may be provided via an article of manufacture by a machine/electronic device/hardware. An article of manufacture may include a machine accessible/readable medium having content to provide instructions, data, etc. The content may result in an electronic device, for example, a filer, a disk, or a disk controller as described herein, performing various operations or executions described.

Portions of various embodiments of the present invention may be provided as a computer program product, which may include a computer-readable medium having stored thereon computer program instructions, which may be used to program a computer (or other electronic devices) to perform a process according to the embodiments of the present invention. The machine-readable medium may include, but is not limited to, floppy diskettes, optical disks, compact disk read-only memory (CD-ROM), and magneto-optical disks, ROM, random access memory (RAM), erasable programmable read-only memory (EPROM), EEPROM, DRAM, SRAM, magnet or optical cards, flash memory, or other type of media/machine-readable medium suitable for storing electronic instructions. Moreover, the present invention may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present invention. It will be apparent to those skilled in the art that many further modifications and adaptations can be made. The particular embodiments are not provided to limit the invention but to illustrate it. The scope of the embodiments of the present invention is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example of the present invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the present invention, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

What is claimed is:

1. A method comprising:
coding a memory that uses one or more serial links for communication is performed, wherein coding includes coding first small code blocks of a first code block and second small code blocks of a second code block, wherein the coding of the first and second small code blocks is performed such that a maximum run length is maintained, wherein the coding of the memory is performed concurrently with coding of a command, wherein the coding includes encoding or decoding, wherein selection of encoding of the command enables decoding of the command without passing a code decoder.

2. The method of claim 1, further comprising:
receiving an incoming stream including the first code block and the second code block; and
partitioning the first code block into the first small code blocks, and partitioning the second code block into the second small code blocks.

3. The method of claim 1, further comprising mapping the first small code blocks to the second small code blocks, wherein the first small code blocks comprise a first 5 bit block, and two first 6 bit blocks.

4. The method of claim 1, wherein the second small code blocks comprise a first 6 bit block, and two first 7 bit blocks.

5. The method of claim 1, wherein the coding of the first and second small code blocks is performed in parallel to minimize latency.

6. The method of claim 1, wherein the run length is maintained by satisfying run length requirements, wherein the run length requirements include one or more of: a maximum overall run length, a maximum header run length, and a maximum tail run length.

7. The method of claim 1, further comprising merging the first small code blocks into the second small code blocks to form a coded code block, wherein the coding is applied to one or more of dynamic random access memory (DRAM), static random access memory (SRAM), read only memory (ROM), and flash memory.

8. A system comprising:

a coder to code a memory that uses one or more serial links for communication is performed, wherein coding includes coding first small code blocks of a first code block and second small code blocks of a second code block, wherein the coding of the first and second blocks is performed such that a maximum run length is maintained, wherein the coding of the memory is performed concurrently with coding of a command, wherein the coding includes encoding or decoding, wherein selection of encoding of the command enables decoding of the command without passing a code decoder.

9. The system of claim 8 further comprising:

a coding circuit to receive an incoming stream including the first code block and the second code block, the coding circuit having a coder to partition the first code block into first small code blocks, and partition the second code block into second small code blocks.

10. The system of claim 8, wherein the coder is further to map the first small code blocks to the second small code blocks, wherein the first small code blocks comprise a first 5 bit block, and two first 6 bit blocks.

11. The system of claim 8, wherein the second small code blocks comprise a first 6 bit block, and two first 7 bit blocks.

12. The system of claim 8, wherein the coding of the first and second small code blocks is performed in parallel to minimize latency.

13. The system of claim 8, wherein the run length is maintained by satisfying run length requirements, wherein the run length requirements include one or more of: a maximum overall run length, a maximum header run length, and a maximum tail run length.

14. The system of claim 8, wherein the coder is further to merge the first small code blocks into the second small code blocks to form a coded code block wherein the coding is applied to one or more of dynamic random access memory (DRAM), static random access memory (SRAM), read only memory (ROM), and flash memory.

15. A coding apparatus comprising a coder, the coder to:

code a memory that uses one or more serial links for communication is performed, wherein coding includes coding the first small code blocks of the first code block and the second small code blocks of the second code block, wherein the coding of the first and second blocks is performed such that a maximum run length is maintained, wherein the coding of the memory is performed concurrently with coding of a command, wherein the coding includes encoding or decoding, wherein selection of encoding of the command enables decoding of the command without passing a code decoder.

16. The coding apparatus of claim 15, the coder is further to:

receive an incoming stream including a first code block and a second code block;

partition the first code block into first small code blocks; and partition the second code block into second small code blocks.

17. The coding apparatus of claim 15, wherein the coder is further to map the first small code blocks to the second small code blocks, wherein the first code blocks comprise a first 5 bit block, and two first 6 bit blocks.

18. The coding apparatus of claim 15, wherein the second small code blocks comprise a first 6 bit block, and two first 7 bit blocks.

19. The coding apparatus of claim 15, wherein the coding of the first and second code blocks is performed in parallel to minimize latency.

20. The coding apparatus of claim 15, wherein the run length is maintained by satisfying run length requirements, wherein the run length requirements include one or more of: a maximum overall run length, a maximum header run length, and a maximum tail run length.

21. A method comprising:

partitioning a first code sequence into a first small code sequences;

partitioning a second code sequence into a second small code sequences;

mapping the first smaller code sequences into the second small code sequences; and minimizing latency by performing code decoding, in parallel, of the first and second code sequences and the first and second small code sequences.

* * * * *